US009123828B2

(12) United States Patent
Hüsken et al.

(10) Patent No.: US 9,123,828 B2
(45) Date of Patent: Sep. 1, 2015

(54) SEMICONDUCTOR DEVICE AND METHOD FOR FORMING A SEMICONDUCTOR DEVICE

(71) Applicant: Infineon Technologies AG, Neubiberg (DE)

(72) Inventors: Holger Hüsken, München (DE); Anton Mauder, Kolbermoor (DE); Hans-Joachim Schulze, Taufkirchen (DE); Wolfgang Rösner, Ottobrunn (DE); Holger Schulze, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/080,098

(22) Filed: Nov. 14, 2013

(65) Prior Publication Data

US 2015/0130013 A1     May 14, 2015

(51) Int. Cl.
*H01L 21/28* (2006.01)
*H01L 29/872* (2006.01)
(Continued)

(52) U.S. Cl.
CPC .............. *H01L 29/872* (2013.01); *H01L 29/47* (2013.01); *H01L 29/66143* (2013.01)

(58) Field of Classification Search
CPC ..................... H01L 29/66143; H01L 29/8725; H01L 29/417
USPC ................................... 438/312, 571; 257/472
See application file for complete search history.

(56) References Cited

U.S. PATENT DOCUMENTS 4,587,547 A    5/1986  Amemiya et al.
5,063,428 A    11/1991 Schlangenotto et al.
(Continued)

FOREIGN PATENT DOCUMENTS

DE        19804580 C2    3/2002
DE        10330571 B4    8/2006
(Continued)

OTHER PUBLICATIONS

Matsudai, et al. "1200V SC(Schottky Controlled Injection)-Diode, An Advanced Fast Recovery Concept with High Carrier Lifetime." Proceedings of the 25th International Symposium on Power Semiconductor Devices & ICs, Kanazawa. May 2013. pp. 339-342.
Mauder, et al "Semiconductor Device with Trench Structures." U.S. Appl. No. 13/487,540, filed Jun. 4, 2012.
(Continued)

*Primary Examiner* — Caridad Everhart
(74) *Attorney, Agent, or Firm* — Murphy, Bilak & Homiller, PLLC (57) ABSTRACT

A semiconductor device includes at least one ohmic contact region between a semiconductor substrate of the semiconductor device and an electrically conductive structure arranged adjacent to the semiconductor substrate. Further, the semiconductor device includes at least one Schottky contact region between the semiconductor substrate of the semiconductor device and the electrically conductive structure. The at least one ohmic contact region is arranged adjacent to the at least one Schottky contact region. The semiconductor substrate includes a first doping layer arranged adjacent to the electrically conductive structure. An average doping concentration of the surface region of the first doping layer in an area of the at least one ohmic contact region differs from an average doping concentration of the surface region of the first doping layer in an area of the at least one Schottky contact region by less than 10%.

17 Claims, 8 Drawing Sheets

(51) Int. Cl.
*H01L 29/66* (2006.01)
*H01L 29/47* (2006.01)

(56) References Cited

U.S. PATENT DOCUMENTS

| | | |
|---|---|---|
| 7,233,031 B2 | 6/2007 | Mauder et al. |
| 2008/0070397 A1* | 3/2008 | Lochtefeld et al. ............ 438/597 |
| 2010/0171126 A1* | 7/2010 | Briere .............................. 257/76 |
| 2011/0233563 A1* | 9/2011 | Sugai et al. ...................... 257/77 |
| 2014/0138698 A1* | 5/2014 | Lin ................................... 257/76 |

FOREIGN PATENT DOCUMENTS

| | | |
|---|---|---|
| DE | 102006025958 B3 | 10/2007 |
| DE | 102006047244 A1 | 4/2008 |

OTHER PUBLICATIONS

Huesken, et al. "Power Semiconductor Diode, IGBT, and Method for Manufacturing Thereof." U.S. Appl. No. 13/274,411, filed Oct. 17, 2011.

Werber, et al. "IGBT with Emitter Electrode Electrically Connected with an Impurity Zone." U.S. Appl. No. 13/941,829, filed Jul. 15, 2013.

* cited by examiner

SEMICONDUCTOR DEVICE AND METHOD FOR FORMING A SEMICONDUCTOR DEVICE

TECHNICAL FIELD

Embodiments relate to measures for reducing switching losses of semiconductor devices and in particular to a semiconductor device and a method for forming a semiconductor device.

BACKGROUND

The reduction of losses during the operation of semiconductor devices is of general interest. For example, the switching losses cause significant contribution to the overall losses for fast switching devices. Further, the improvement of the robustness of semiconductor devices is also of general interest. Therefore, it may be desired to reduce the switching losses of semiconductor devices, while providing devices with high robustness or durability.

SUMMARY

Some embodiments relate to a semiconductor device comprising at least one ohmic contact region between a semiconductor substrate of the semiconductor device and an electrically conductive structure arranged adjacent to the semiconductor substrate. Further, the semiconductor device comprises at least one Schottky contact region between the semiconductor substrate of the semiconductor device and the electrically conductive structure. The at least one ohmic contact region is arranged adjacent to the at least one Schottky contact region. The semiconductor substrate comprises a first doping layer arranged adjacent to the electrically conductive structure. An average doping concentration of the surface region of the first doping layer in an area of the at least one ohmic contact region differs from an average doping concentration of the surface region of the first doping layer in an area of the at least one Schottky contact region by less than 10% of the average doping concentration of the surface region of the first doping layer in the area of the at least one Schottky contact region.

Some further embodiments relate to a semiconductor device comprising at least one first contact region between a semiconductor substrate of the semiconductor device and an electrically conductive structure arranged adjacent to the semiconductor substrate. Further, the semiconductor device comprises at least one second contact region between the semiconductor substrate of the semiconductor device and the electrically conductive structure. The at least one first contact region is arranged adjacent to the at least one second contact region. The electrically conductive structure comprises a first electrically conductive material in contact with the semiconductor substrate within an area of the at least one first contact region and a second electrically conductive material in contact with the semiconductor substrate in an area of the at least one second contact region so that the first contact characteristic within the at least one first contact region differs from a second contact characteristic within the at least one second contact region.

Further embodiments relate to a method for forming a semiconductor device. The method comprises forming a doping layer arranged at a main surface of the semiconductor substrate at least by homogenously implanting dopants within at least one first contact region and at least one second contact region arranged adjacent to the at least one first contact region. Further, the method comprises forming an electrically conductive structure arranged adjacent to the semiconductor substrate. A contact characteristic in an area of the at least one first contact region differs from a contact characteristic in an area of the at least one second contact region.

BRIEF DESCRIPTION OF THE FIGURES

Some embodiments of apparatuses and/or methods will be described in the following by way of example only, and with reference to the accompanying figures, in which

FIGS. 3a-4c show schematic cross sections of semiconductor devices;

FIG. 5a shows a schematic cross section of a semiconductor diode;

FIG. 5b shows a schematic doping profile of the semiconductor diode shown in FIG. 5a;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
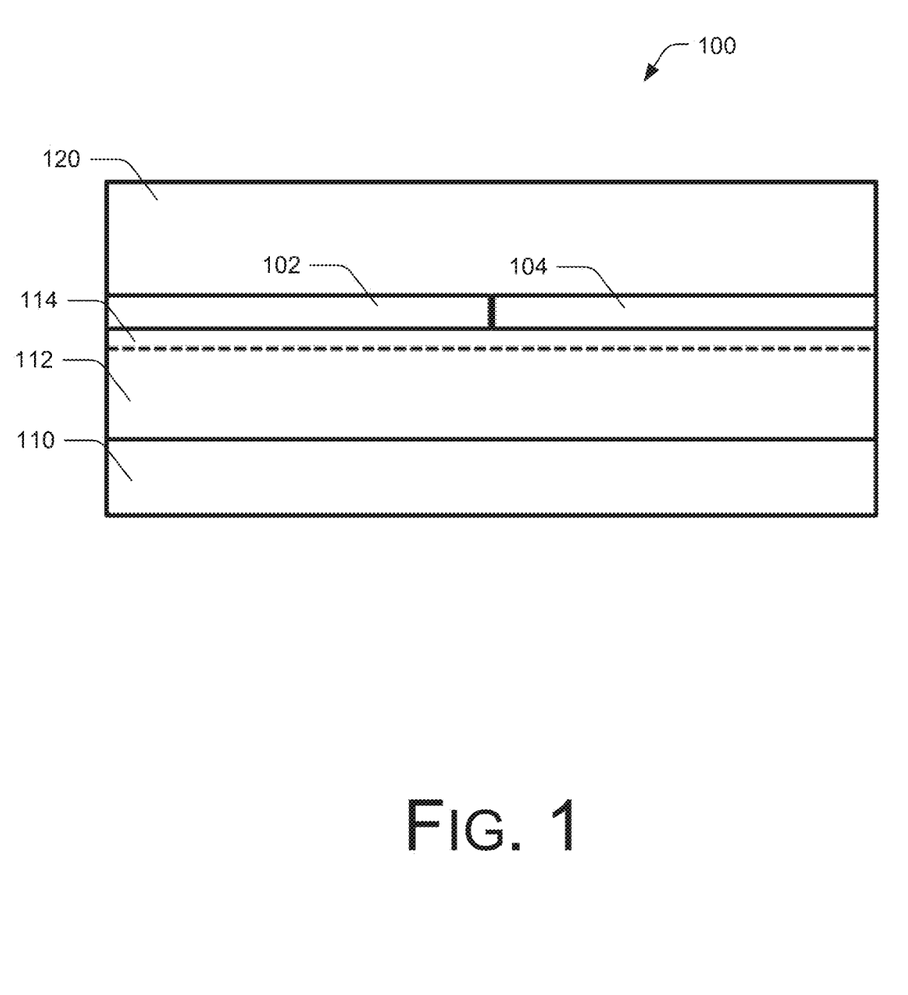
FIG. 1 shows a schematic cross section of a semiconductor device.

FIG. 1 shows a schematic cross section of a part of a semiconductor device 100 according to an embodiment. The semiconductor device 100 comprises at least one ohmic contact region 102 between a semiconductor substrate 110 of the semiconductor device 100 and an electrically conductive structure 120 arranged adjacent to the semiconductor substrate 110. Further, the semiconductor device 100 comprises at least one Schottky contact region 104 between the semiconductor substrate 110 of the semiconductor device 100 and the electrically conductive structure 120. The at least one ohmic contact region 102 is arranged adjacent to the at least one Schottky contact region 104. The semiconductor substrate 110 comprises a first doping layer 112 arranged adjacent to the electrically conductive structure 120. Further, and average doping concentration of a surface region 114 of the first doping layer 112 in an area of the at least one ohmic contact region 102 differs from an average doping concentration of the surface region 114 of the first doping layer 112 in an area of the at least one Schottky contact region 104 by less than 10% of the average doping concentration of the surface region 114 of the first doping layer 112 in the area of the at least one Schottky contact region 104.

Figure 2:
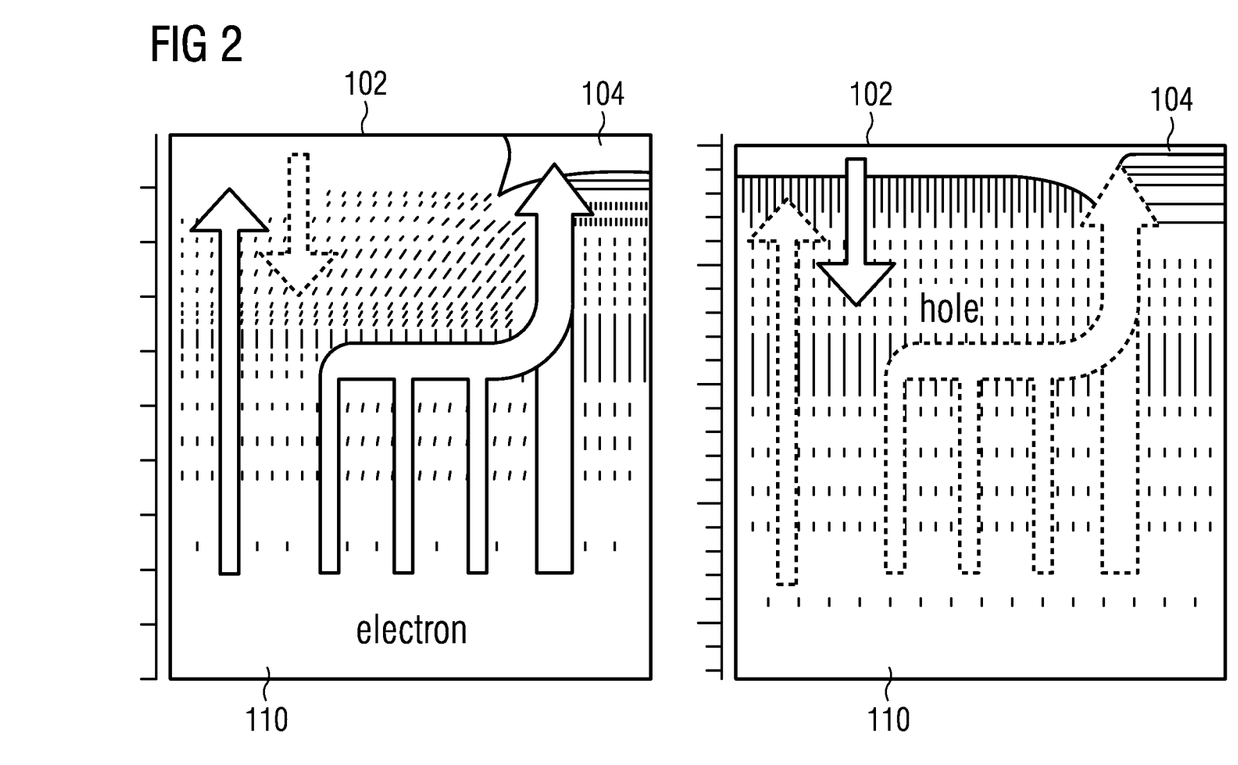
FIG. 2 shows a schematic charge carrier movement within a semiconductor device.

By implementing regions with different contact characteristic (ohmic contact vs. Schottky contact) the injection efficiency between the electrically conductive structure 120 and the first doping layer 112 can be influenced, adapted or set to a desired value, although the doping concentration within the surface region 114 is very homogenous due to the low variation. Due to the homogenous doping distribution, a device with high robustness at fast commutation processes may be provided. Further, the blocking properties of the device may be very homogenous over the areas of the first doping layer located within the ohmic and Schottky contact regions. Further, the semiconductor device 100 may be formed with low effort, since a masking of Schottky or ohmic contact regions during implant of the first doping layer 112 may be avoided. FIG. 2 shows a schematic example of an electron current (left side) and a hole current (right side) through an ohmic contact region 102 and a neighboring Schottky contact region 104. In this example, only the ohmic contact region 102 provides an injection of holes (e.g. neglecting leakage currents within the Schottky contact region). In this way, the mean injection efficiency may be adapted or reduced, for example.

The semiconductor device 100 may be implemented by any semiconductor processing technology capable of forming the mentioned structures, for example. In other words, the semiconductor substrate 110 of the semiconductor device 100 may be a silicon-based semiconductor substrate, a silicon carbide-based semiconductor substrate, a gallium arsenide-based semiconductor substrate or a gallium nitride-based semiconductor substrate, for example.

The electrically conductive structure 120 may comprise any electrically conductive material and may comprise an arbitrary geometry as long as the electrically conductive structure is in contact with the semiconductor substrate 110 at least within the at least one ohmic contact region 102 and the at least one Schottky contact region 104. In other words, the semiconductor substrate 110 may comprise a main surface in contact with the electrically conductive structure 120. In still other words, the electrically conductive structure 120 may be arranged vertically adjacent to the main surface of the semiconductor substrate 110.

A main surface of the semiconductor substrate 110 may be a semiconductor surface of the semiconductor substrate 110 towards metal layers, insulation layers and/or passivation layers on top of the semiconductor surface. In comparison to a basically vertical edge (e.g. resulting from separating the semiconductor substrate from others) of the semiconductor substrate 110, the main surface of the semiconductor substrate 110 may be a basically horizontal surface extending laterally. The main surface of the semiconductor substrate 110 may be a basically even plane (e.g. neglecting unevenness of the semiconductor structure due to the manufacturing process or trenches). In other words, the main surface of the semiconductor substrate 110 may be the interface between the semiconductor material and the electrically conductive structure 120 on top of the semiconductor substrate 110. Further, a lateral direction or lateral expansion may be oriented basically in parallel to the main surface and a vertical direction or vertical expansion may be oriented basically orthogonal to the main surface.

At least one ohmic contact region 102 is arranged formed between the semiconductor substrate 110 and the electrically conductive structure 120. The ohmic contact region may be a part of the main surface of the semiconductor substrate 110, in which an ohmic contact is established or formed between the semiconductor substrate 110 and the electrically conductive structure 120. The area of the main surface of the semiconductor substrate 110 occupied by the at least one ohmic contact region 102 may comprise an arbitrary size and/or geometry. Further, an arbitrary number of ohmic contact regions 102 (e.g. arranged randomly or periodically over the main surface) may be arranged between the semiconductor substrate 110 and the electrically conductive structure 120.

Further, the at least one Schottky contact region 104 is arranged or formed between the semiconductor substrate 110 and the electrically conductive structure 120. The at least one Schottky contact region 104 may occupy a part of the main surface of the semiconductor substrate 110, in which a Schottky contact is established between the semiconductor substrate 110 and the electrically conductive structure 120. Similarly to the ohmic contact region 102, the at least one Schottky contact region 104 may comprise an arbitrary geometry and/or size and/or an arbitrary number of Schottky contact regions 104 may be distributed over the main surface of the semiconductor device 110.

The at least one ohmic contact region 102 is arranged laterally adjacent to the at least one Schottky contact region 104 at the main surface of the semiconductor substrate 110. In other words, the area of the main surface of the semiconductor device 110 occupied by the at least one ohmic contact region 102 joins or touches at least at one point or at one side the area of the main surface of the semiconductor substrate 110 occupied by the at least one Schottky contact region 104. For example, the at least one ohmic contact region 102 surrounds the at least one Schottky contact region 104 or the at least one Schottky contact region 104 surrounds the at least one ohmic contact region 102.

Further, the first doping layer 112 is formed within the semiconductor substrate 110. The first doping layer may comprise at least mainly a first conductivity type (n-doping or p-doping). The first doping layer 112 is arranged at the main surface of the semiconductor substrate 110 adjacent to the electrically conductive structure 120 and extends laterally along the main surface of the semiconductor substrate 110.

The first doping layer 112 may extend laterally over the whole semiconductor substrate or may be limited to a part (e.g. active region) of the semiconductor substrate 110 (e.g. implemented by a well implantation).

Further, the first doping layer 112 comprises a thickness reaching from the main surface of the semiconductor substrate 110 vertically into the semiconductor substrate 110.

The first doping layer 112 comprises a very homogenous doping distribution at least in a surface region 114 of the first doping layer 112 and at least in the area of the ohmic contact region 102 and the Schottky contact region 104. The surface region 114 may be a part of the first doping layer 112 arranged directly at the main surface of the semiconductor substrate 110 and may be shallow in comparison to the first doping layer 112. For example, the surface region 114 of the first doping layer 112 reaches into an average depth of less than 10% (or less than 30%, less than 20%, less than 5% or less than 1%) of an average thickness of the first doping layer. Alternatively or additionally, the surface region 114 of the first doping layer 112 may comprise an average depth of less than 250 nm (or less than 500 nm, less than 200 nm, less than 150 nm or less than 100 nm), for example.

The average thickness of the first doping layer 112 may be a thickness of the first doping layer 112 averaged at least over the ohmic contact region 102 and the Schottky contact region 104, for example. Similarly, the average depth of the surface region 114 of the first doping layer 112 may be a depth of the surface region 114 averaged over at least the ohmic contact region 102 and the Schottky contact region 104. For example, the average thickness of the first doping layer 112 and/or the average depth of the surface region 114 may be constant (e.g. neglecting tolerances due to manufacturing variations) over at least the ohmic contact region 102 and the Schottky contact region 104.

An average doping concentration of the surface region 114 of the first doping layer 112 below the ohmic contact region 102 differs from an average doping concentration of the surface region 114 of the first doping layer 112 below the Schottky contact region 104 by less than 10% of the average doping concentration below the Schottky contact region 104. An average doping concentration of the surface region 114 below the ohmic contact region may be the doping concentration within the surface region 114 averaged over the volume of the surface region 114 in the area of the ohmic contact region 102. Similarly, the average doping concentration of the surface region 114 below the Schottky contact area 104 may be the doping concentration of the surface region 114 averaged over the volume of the surface region 114 in the area of the Schottky contact region 104.

The area of the at least one ohmic contact region 102 may be the part of the surface region 114 of the first doping layer 112 located within a vertical projection of the ohmic contact region 102. Similarly, the area of the at least one Schottky contact region 104 of the surface region 114 of the first doping layer 112 may be a region of the surface region 114 of the first doping layer 112 located within a vertical projection of the Schottky contact region 104, for example.

For example, the first doping layer 112 may comprise an average doping concentration within the surface region 114 and/or within the whole first doping layer 112 between $1e12$ $cm^3$ and $1e14$ $cm^3$ or an area dose (e.g. dose integrated over the depth) may be in the range of $1e12$ $cm^{-2}$ and $1e14$ $cm^{-2}$.

As already mentioned, the semiconductor device 100 may comprise a plurality of ohmic contact regions 102 separated by at least one Schottky contact region 104 (or a plurality of Schottky contact regions) and/or may comprise a plurality of Schottky contact regions 104 separated by at least one ohmic contact region 102 (or by a plurality of ohmic contact regions).

The plurality of ohmic contact regions 102 and/or the plurality of Schottky contact regions 104 may be distributed arbitrarily over the main surface of the semiconductor substrate 110 and may comprise an arbitrary geometry and size. For example, the plurality of ohmic contact regions 102 and the plurality of Schottky contact regions 104 may comprise a rectangular shape, a line-shape or may be grid-shaped (e.g. periodically enclosing squares, rectangles or circles of ohmic contact regions or Schottky contact regions), for example.

Figure 6:
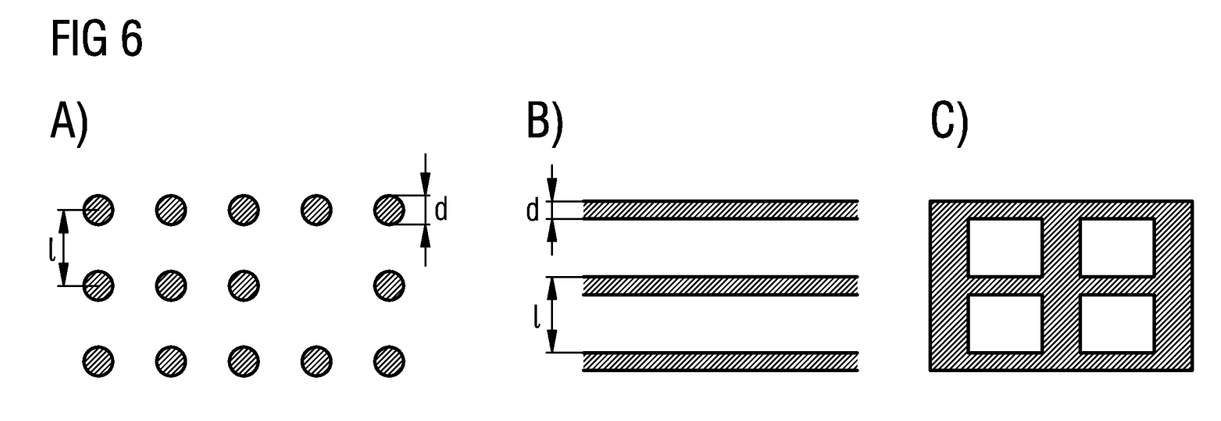
FIGS. 6a-6c show schematic top views of contact regions of semiconductor devices.

For example, FIG. 6a shows a top view of a part of a semiconductor device with a plurality of circular ohmic contact regions with a diameter d and a distance l from each other and a surrounding Schottky contact region or vice versa. Alternatively, FIG. 6b shows a schematic top view of a semiconductor device of stripe shaped ohmic contact regions with a width d and a distance l to a neighboring ohmic contact region separated by Schottky contact regions or vice versa. Further alternatively, FIG. 6c shows a schematic top view of a semiconductor device with a plurality of square shaped or rectangular shaped ohmic contact regions surrounded by a grid-shaped Schottky contact region or vice versa.

FIGS. 6a-6c may show possible arrangements of Schottky and ohmic contacting regions in top view of an anode. For example, circles of Schottky contacts are arranged in a region of ohmic contacts, circles of ohmic contacts may be arranged in regions of Schottky contacts, alternating stripes of ohmic and Schottky contacts may be implemented, polygons (e.g. rectangles or hexagons) of ohmic contacts may be implemented in regions of Schottky contacts or polygons (e.g. rectangles or hexagons) with ohmic contacts may be implemented in regions with ohmic contact. Further, the structures may be arranged periodically or regularly with missing structures or imperfections (e.g. for polygons), for example.

Optionally, alternatively or additionally to one or more aspects mentioned above, a maximal lateral dimension of the at least one ohmic contact region and/or a maximal lateral dimension of the at least one Schottky contact region 104 may be smaller than (or smaller than 80%, smaller than 50%, smaller than 30% or smaller than 10%) the thickness of the semiconductor substrate (e.g. vertical dimension of the semiconductor substrate), smaller than (or smaller than 80%, smaller than 50%, smaller than 30% or smaller than 10%) a distance between anode and cathode region (e.g. the substrate may be significantly thicker than the actual drift zone, e.g. for 600V diodes with epitaxial structure) or smaller than twice (or smaller than once, smaller than 80%, smaller than 50%, smaller than 30% or smaller than 10%) a diffusion length of charge carriers (e.g. electrons or holes) within in the semiconductor substrate (e.g. within the first doping layer or a drift layer of the semiconductor device).

In other words, the dimension of the mentioned regions (ohmic contact region and/or Schottky contact region) may be selected or implemented so that the induced variation of the plasma concentration (e.g. concentration of free charge carriers) in an on-state case may be compensated or balanced by lateral compensation processes within a small depth towards the other surface of the semiconductor substrate or a cathode (e.g. up to the half of a drift zone or closer to the anode). For this, the structure size (size of the ohmic contact region and/or Schottky region) may be in the region of the diffusion length (of charge carriers) or maximally a thickness of the drift zone (e.g. in the region of 1-50 μm for a 600 Volts diode), for example. The area portions (area ratio) of the different contact variants may be selected arbitrarily and may also vary over the chip or semiconductor device, for example.

Optionally, alternatively or additionally to one or more aspects mentioned above, an average area of the semiconductor substrate 110 occupied by an ohmic conduct region 102 decreases from a center of the semiconductor substrate 110 towards an edge of the semiconductor substrate 110. The average area occupied by the ohmic contact region may be equal to a ratio of area occupied by ohmic contact regions to areas occupied by Schottky contact regions within a part of the semiconductor substrate 110. For example, the average area of semiconductor substrate occupied by an ohmic contact region may be constant within a central region of the semiconductor substrate and may decrease towards an edge region of the semiconductor substrate 110.

In other words, optionally, the semiconductor device 100 may comprise an edge region (e.g. edge termination region for reducing electrical fields towards the edge of the semiconductor substrate) located at an edge of the semiconductor substrate 110 surrounding an active region (e.g. region of the semiconductor substrate used for a main functionality of the semiconductor device) of the semiconductor substrate 110. The at least one ohmic contact region 102 and the at least one Schottky contact region 104 may be arranged within the active region of the semiconductor substrate.

The active region of the semiconductor substrate 110 may comprise a central region with constant average area occupied by an ohmic contact region and a transition region towards the edge region with reduced average area occupied by an ohmic contact region, for example.

In other words, the arrangement of the contact scheme within a transition region towards a high voltage edge termination may deviate from the scheme used in the remaining active area by reducing the average injection efficiency of an anode towards the edge region and consequently reducing or suppressing a charge carrier injection in regions below the high voltage edge, for example. In this way, the commutation robustness of the edge construction may be increased. This measure may be implemented with low effort in comparison to a backside structuring of a backside emitter, for example.

An arrangement as described above may optionally comprise a pattern changing at the edge of the active regions (e.g. towards a high voltage edge termination) and may provide a further modulation of the anode efficiency towards the high voltage edge (e.g. towards a lower efficiency), for example.

Optionally, alternatively or additionally to one or more aspects mentioned above, an average thickness of the first doping layer 112 in the area of the at least one ohmic contact region 102 differs from an average thickness of the first doping layer 112 in the area of the at least one Schottky conduct region 104 by less than 10% (or less than 30%, less than 20%, less than 5% or less than 1%) of the average thickness of the first doping layer 112 in the area of the at least one Schottky contact region 104. In other words, the surface region 114 of the first doping layer 112 as well as the whole first doping layer 112 may be implemented very homogenously (e.g. very homogenous doping distribution).

For example, the average thickness of the first doping layer may be between 0.5 μm and 10 μm (or between 1 μm and 5 μm).

The thickness of the first doping layer 112 may be determined or defined by a pn-junction towards another doping region of the semiconductor substrate 110. For example, the semiconductor substrate 110 comprises a second doping layer arranged adjacent to the first doping layer 112. The first doping layer 112 may comprise at least mainly the first conductivity type and the second doping layer may comprise at least mainly a second conductivity type.

In other words, the first doping layer 112 may comprise the first conductivity type which can be a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate a p-doping and the second conductivity type may indicate an n-doping or viceversa.

The first doping layer 112 may comprise mainly the first conductivity type, if the part of the semiconductor substrate 110 occupied by the first doping layer 112 comprises a doping of the first conductivity type over more than 70% (or more than 80% or more than 90%) of the volume occupied by the first doping layer 112, for example. Further, the second doping layer may comprise mainly the second conductivity type, if the part of the semiconductor substrate 110 occupied by the second doping layer comprises a doping of the second conductivity type over more than 70% (or more than 80% or more than 90%) of the volume occupied by the second doping layer, for example.

For example, the second doping layer may be a drift layer of a semiconductor device (e.g. semiconductor diode) or may comprise one or more optional sub-layers (e.g. drift layer, field stop layer and/or cathode or emitter layer). The second doping layer may comprise also parts comprising the first conductivity type separated from the first doping layer 112 (e.g. for adjusting and emitter efficiency of the backside emitter).

For example, a pit-junction between the first doping layer 112 and the second doping layer comprises an average distance (corresponding to the average thickness) to the main surface of the semiconductor substrate 110 along the at least one ohmic conduct region 102 and a second average distance (corresponding to the average thickness) to the main surface of the semiconductor substrate 110 along the at least one Schottky conduct region 104. The first average distance may differ from the second average distance by less than 10% (or less than 30%, less than 20%, less than 5% or less than 1%), for example.

The at least one ohmic contact region 102 and the at least one Schottky contact region 104 can be established or implemented in various ways. For example, the electrically conductive structure may comprise different electrically conductive materials causing different contact characteristics. In other words, the electrically conductive structure 120 may comprise a first electrically conductive material in contact with the semiconductor substrate 110 within the at least one ohmic contact region 102 and a second electrically conductive material in contact with the semiconductor substrate 110 within the at least one Schottky contact region 104. In this way, the implementation of doping regions within the semiconductor substrate 110 of the semiconductor device 100 may be independent from the establishment of the different contact regions, for example.

The first electrically conductive material may be any material establishing an ohmic contact to the semiconductor substrate 110 (e.g. considering the doping concentration of the surface region of the first doping layer). For example, the first electrically conductive material may comprise aluminum, copper, an aluminum silicon alloy, an aluminum silicon copper alloy, gold, a platinum silicon alloy, an iridium silicon alloy or an osmium silicon alloy. Additionally, the first electrically conductive material may comprise a barrier material or a barrier layer (e.g. avoiding diffusion of material into the semiconductor substrate) towards the semiconductor substrate 110 as for example titanium or a titanium tungsten alloy. The barrier material or barrier layer may be sufficiently thin to enable an ohmic contact between that the electrically conductive material and the semiconductor substrate 110.

Further, the second electrically conductive material may comprise or consist of titanium or a titanium tungsten alloy, for example.

Figure 3:
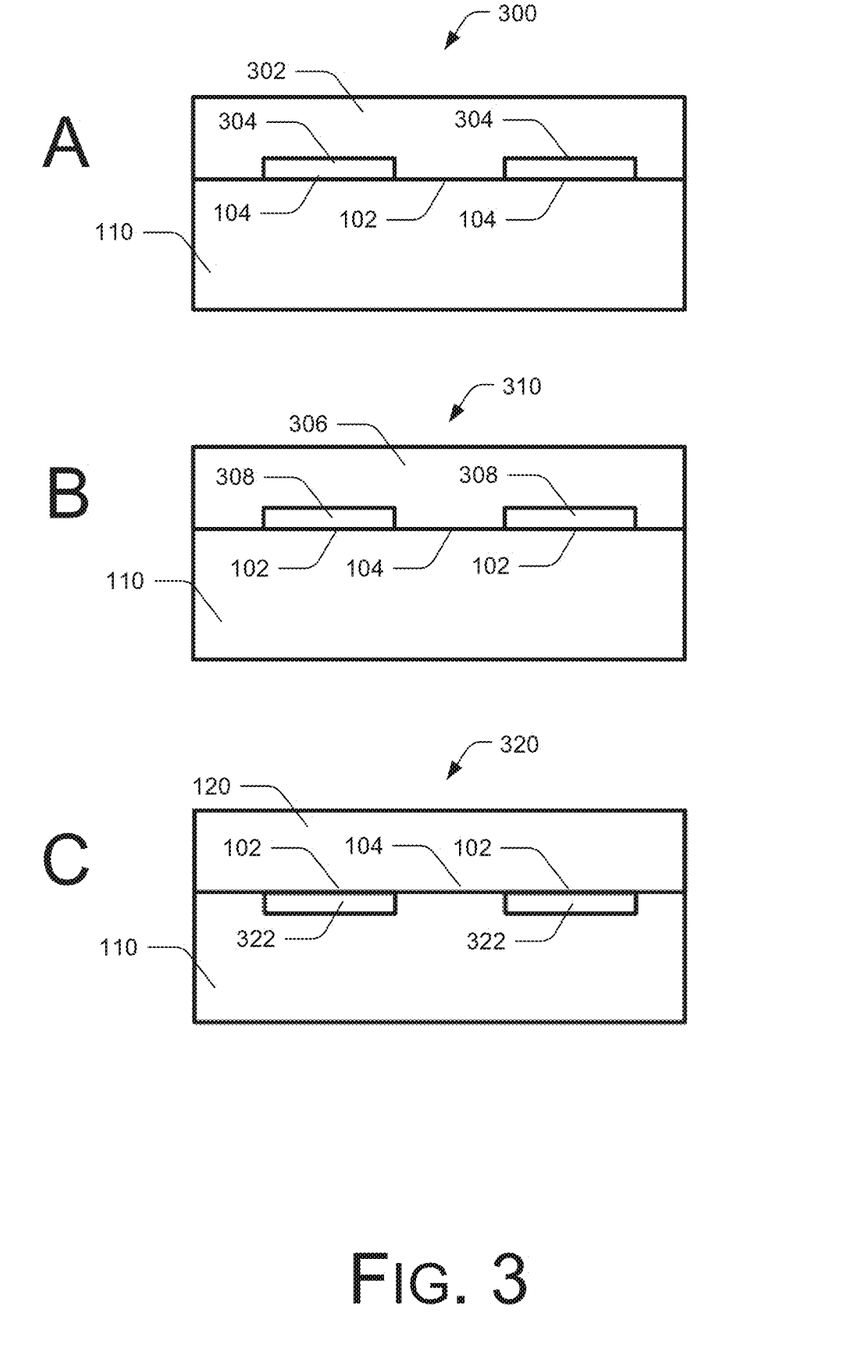

FIG. 3a shows a schematic cross section of a part of a semiconductor device 300 according to an embodiment. The implementation of the semiconductor device 300 is similar to the implementation shown in FIG. 1. In this example, the electrically conductive structure of the semiconductor device 300 comprises an electrically conductive layer 302 comprising the first electrically conductive material covering the second electrically conductive material 304. The semiconductor device 300 comprises a plurality of areas comprising the second electrically conductive material 304 (e.g. anode metal implementing a Schottky contact to an anode) and the electrically conductive layer 302 (e.g. anode metal implementing an ohmic contact to an anode) is in contact with the semiconductor substrate 110 between the areas occupied by the second electrically conductive material 304.

The first doping layer of the semiconductor substrate 110 may comprise a p-doping and may implement an anode of the semiconductor device 300 (e.g. of semiconductor diode), for example. In the example shown in FIG. 3a, a Schottky-forming metallization may be structured and covered with an ohmic-contacting metallization. For example, a Titanium Tungsten Alloy Layer TiW or a Titanium Layer may be deposited and structured. Further, an Aluminum Silicon Alloy Layer AlSi or an Aluminum Silicon Cupper Alloy Layer AlSiCu (or alternatively gold Au, Platinum Silicon Alloy (PtSi, Pt2Si), Iridium Silicon Alloy IrSi or Osmium Silicon Alloy OsSi2 on TiW/Ti (e.g. barrier layer of Titanium Tungsten Alloy and Titanium) or Silicon may be deposited. Optionally, this electrically conductive structure may be followed by further metallization layers, for example.

More details and aspects are mentioned in connection with the described concept or one or more embodiments described above (e.g. FIG. 1).

FIG. 3b shows a schematic cross section of a part of a semiconductor device 310 according to an embodiment. The implementation of the semiconductor device 310 is similar to the implementation shown in FIG. 3a. However, in this example, the electrically conductive structure comprises an electrically conductive layer 306 comprising the second electrically conductive material (e.g. anode metal implementing a Schottky contact to an anode) covering the first electrically conductive material 308 (e.g. anode metal implementing an ohmic contact to an anode). More details and aspects are mentioned in connection with the described concept or one or more embodiments described above (e.g. FIG. 1 or 3a).

In the example shown in FIG. 3b, a layer forming an ohmic contact to an anode (e.g. aluminum or an aluminum based alloy for p-interface area dopings or also gold) may be deposited and structured. Further, a Schottky-contact-forming metallization (e.g. Titanium Tungsten Alloy TiW or titanium) may be deposited and optionally followed by further metallization layers, for example.

The layer building up or implementing the ohmic contact may be a metal or another material like a quasi-metallic compound or alloy (e.g. PtSi, Pt2Si, IrSi, OsSi), for example. For example, a cost efficient or low complexity diode process (for forming a diode) may be implemented as follows. A lifetime doping in the region of the drift zone (drift layer of diode) may be obtained by a doping of heavy metals (e.g. for diodes with a voltage class between 400 Volts and 1200 Volts). For this, a heavy metal silicon layer may be formed at the anode, which may be used as a quasi-infinite reservoir of heavy metal items during further high temperature acts and may stay at the anode surface for the further course of process. This layer may be closed or not closed. The silicide may be present or may exist by a plurality of single grains. For example, the anode surface may be locally covered with oxide (silicon oxide) before the deposition of the heavy metal silicon layer, on which no silicide is built. In this way, regions without silicide are formed at the anode surface defined by the oxide structuring. For example platinum silicide grains may suppress or avoid the formation of Schottky contacts and may lead to the formation of ohmic contacts also for metals, which establish a Schottky contact on p-doped silicon, for example. By depositing Titanium Ti or a Titanium Tungsten Alloy TiW, for example, on an anode as described before, a Schottky contact may be formed in the regions without silicide grains (e.g. suitable p-interface concentration) and an ohmic contact may be formed in regions with silicide coverage.

Similarly, (for suitable interface dopings) the desired effect may also be obtained by using aluminum as contact metal, since the contact resistance may be significantly increased in regions without silicide coverage. In this way, the desired effect may be also obtained with an aluminum based metallization, for example.

Alternatively or additionally to one or more aspects mentioned above, the semiconductor substrate may comprise a first average defect density within the first surface region 114 of the first doping layer 110 in an area of the at least one ohmic contact region 102 and a second average defect density within the surface region 114 of the first doping layer 112 in an area of the at least on Schottky contact region 104. The first average defect density may be higher (e.g. more than 2×, more than 3×, more than 5× or more than 10×) than the second average defect density, for example.

FIG. 3c shows a schematic cross section of a part of a semiconductor device 320 according to an embodiment. The implementation of the semiconductor device 320 is similar to the implementation shown in FIG. 1. In this example, the electrically conductive structure 120 of the semiconductor device 320 comprises an electrically conductive layer comprising an electrically conductive material establishing a Schottky contact (e.g. anode metal implementing Schottky contact to anode) within the Schottky contact regions 104. Further, the first doping layer comprises regions of increased defect densities 322 within the surface region in the area of the ohmic contact regions 102. Due to the increased defect density the electrically conductive material of the electrical conductive structure 120 usually causing a Schottky contact to the semiconductor substrate 110 establishes an ohmic contact between the electrical conductive structure 120 and the regions of increased defect densities 322. More details and aspects are mentioned in connection with the described concept and/or one or more embodiments described above (e.g. FIG. 1).

For example, the surface structure of the silicon crystal may be locally damaged (e.g. by a shallow structured implantation) so that a high density of surface states prevents from the formation of Schottky contacts. The following deposition of a suitable metallization (e.g. Titanium Tungsten Alloy TiW) may cause a Schottky contact at undamaged regions and forms an ohmic contact at damaged positions, for example. In other words, a local damage implant may be used to damage the surface region of the first doping layer in order to implement one or more ohmic contact regions 102, for example. For example, a non-healed or not fully healed ion implantation or a plasma process or a mechanical surface preparation may be used to increase the defect density.

Some embodiments relate to a semiconductor diode device (e.g. silicon diode). In other words, a semiconductor device according to the described concept or one or more embodiments described above may implement a semiconductor diode device or another device, for example.

Figure 4:
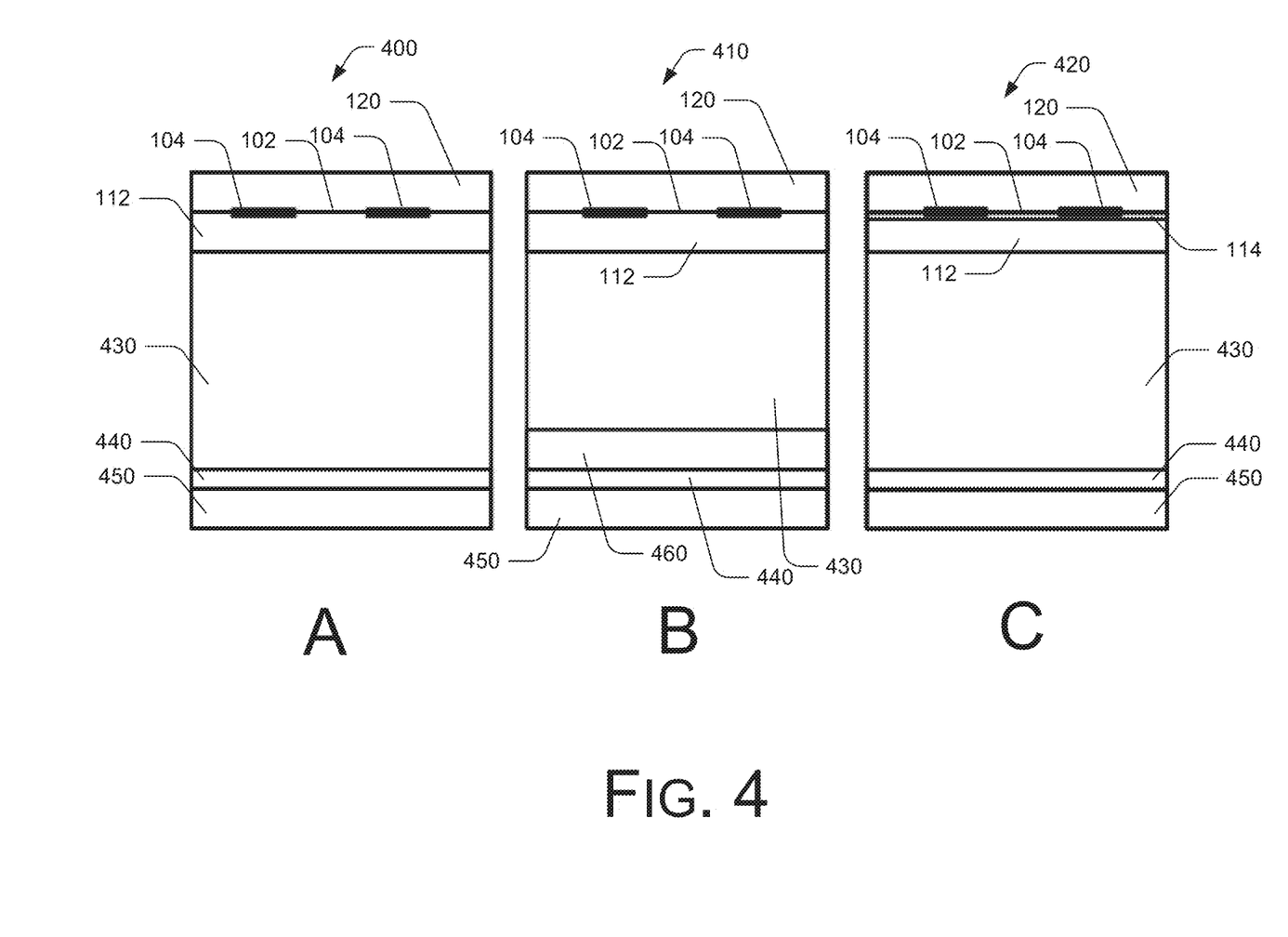

FIG. 4a shows a schematic cross section of a semiconductor device 400 according to an embodiment. The implementation of the semiconductor device 400 is similar to the implementation shown in FIG. 1. However, the semiconductor substrate of the semiconductor device 400 comprises a vertically layer stack comprising the first doping layer 112 arranged that the main surface of the semiconductor substrate (e.g. implementing a p-anode), a second doping layer 430 (e.g. implementing an n-drift zone) and a third doping layer 440 (e.g. implementing a n-cathode layer). Further, the semiconductor device 400 comprises an electrically conductive layer 450 arranged at the backside of the semiconductor substrate opposite to the main surface of the semiconductor substrate (e.g. implementing a cathode contact).

For example, the semiconductor device 400 implements a semiconductor diode with a p-anode electrically connected to an anode contact (electrically conductive structure or metal layer) with alternating ohmic contact regions and Schottky contact regions at the main surface, an n-doped drift layer (e.g. lightly doped) and an n-doped cathode layer (highly doped) connected to a backside metal layer implementing a cathode contact.

More details and aspects are mentioned in connection with the described concept or one or more embodiments described above (e.g. FIG. 1 and FIGS. 3a-3b).

FIG. 4b shows a schematic cross section of a semiconductor device 410 according to an embodiment. The implementation of the semiconductor device 410 is similar to the implementation shown in FIG. 4a. The device 410 comprises additionally a field stop layer 460 (e.g. n-doped) arranged between the drift layer 430 (second doping layer) and the cathode layer (third doping layer) 440.

Further, FIG. 4c shows a schematic cross section of another semiconductor device 420 according to an embodiment. The implementation of the semiconductor device 420 is similar to the implementation shown in FIG. 4a. However the semiconductor device 420 comprises a highly doped surface region 114 of the first doping layer 112 (e.g. implementing a p+ anode contact).

FIGS. 4a-4c show examples for a homogenously implemented anode (e.g. very homogenous doping concentration at least of the surface region of the first doping layer) within the semiconductor material in combination with Schottky and ohmic contacts by suitable implementation of the contacting. Various vertical concepts of diodes are shown. The contact between the anode contact metal and the homogenous anode is implemented alternatingly as ohmic contact 102 and Schottky contact 104.

The anode may be implemented by one or more implantation and/or diffusion profiles (e.g. into the depth of the semiconductor substrate). For example, the anode is implemented homogenously within the semiconductor material, which may mean that the static depletion zone may be established equally or nearly equally in the regions of different contacting. Beside a simple processing or manufacturing, the blocking properties of the diode may be homogenous or very homogenous within the whole active region resulting in a reduction of inhomogeneity also in the commutating case, for example. Two current paths with different barrier height may be provided to electrons provided at the cathode side in an on-state. The injection efficiency of the anode may be reduced in the region of the Schottky like contacting so that a mean of the plasma concentration may be reduced at the front side and the diode induced switching losses (e.g. reverse current peaks) may be reduced. The reduced injection efficiency of the anode may enable an adjustment of a longer lifetime of the plasma charge carriers within the drift zone (e.g. in combination with a low injection efficiency of the cathode) under constant or nearly constant low switching losses reducing undesired temperature effects like a strong increase of the leakage currents with the temperature, for example.

Figure 5:
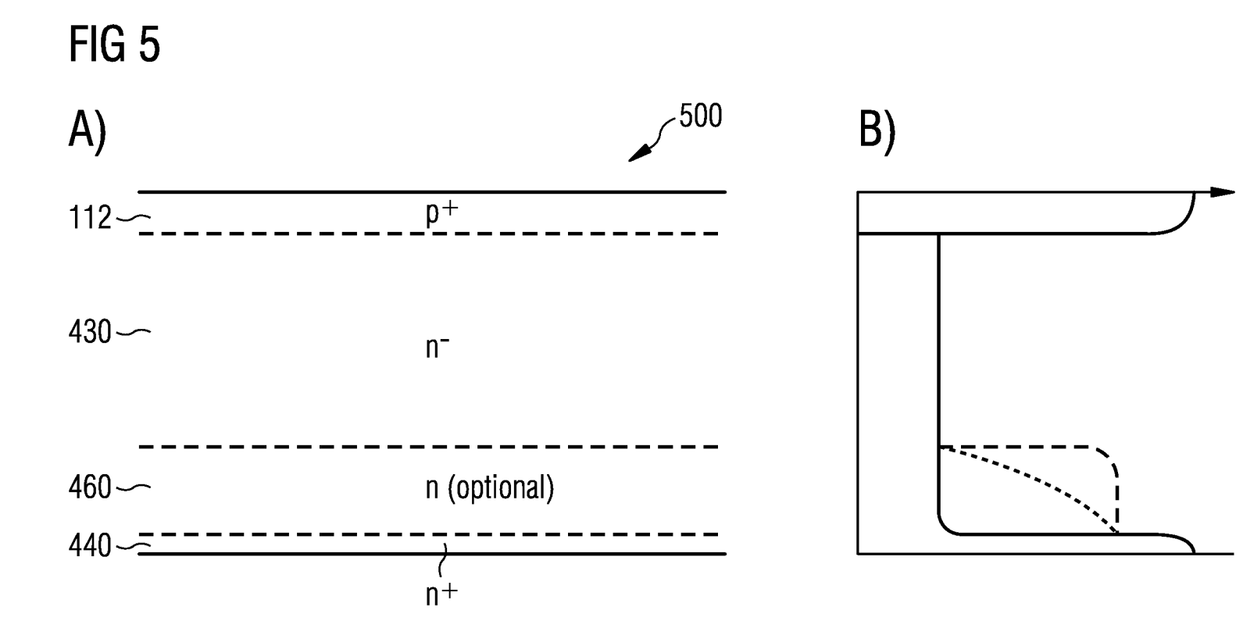

Corresponding to the examples shown in FIGS. 4a-4c, FIG. 5a shows a schematic diode structure 500 and FIG. 5b a corresponding possible doping profile. In FIG. 5a the diode comprises a highly doped p-anode representing the first doping layer 112 at the front side of the semiconductor substrate, a lightly n-doped drift layer 430, an optional medium n-doped field stop layer 460 and a highly n-doped backside emitter layer 440. The corresponding relative doping concentrations are schematically indicated by the doping profile shown in FIG. 5b. The doping of the optional field stop layer is indicated by the dotted lines. FIGS. 5a and 5b may show a schematic example for a bipolar high voltage diode with low switching loss based on a p-i-n-structure (e.g. implemented on silicon). FIG. 5a shows a schematic illustration of the active regions and FIG. 5b a doping profile of a p-i-n-diode, for example.

For example, such a diode comprises a so called drift zone of the first conductivity type (e.g. n-doped, indicated by n−), a front side well of a second conductivity type (e.g. p-doped, indicated by p+) and a back side emitter of the first conductivity type as well (indicated by n+).

Optionally, a further layer (e.g. field stop or buffer) of the first conductivity type can be arranged between the drift zone and the backside emitter, which comprises a conductivity (a doping concentration) between both. The exact course of the conductivity or doping (doping concentration) of the different layers as well as the field stop may be adapted to the desired application, for example.

Some embodiments relate to a semiconductor device comprising a blocking voltage of more than 100 Volt (or more than 400 Volt, more than 600 Volt or more than 1000 Volt). In other words, a semiconductor device according to the described concept or one or more embodiments described above may be a power semiconductor device with at least one electrical element provided by the semiconductor device (e.g. diode) with a blocking voltage of more than 100 Volt.

Figure 7:
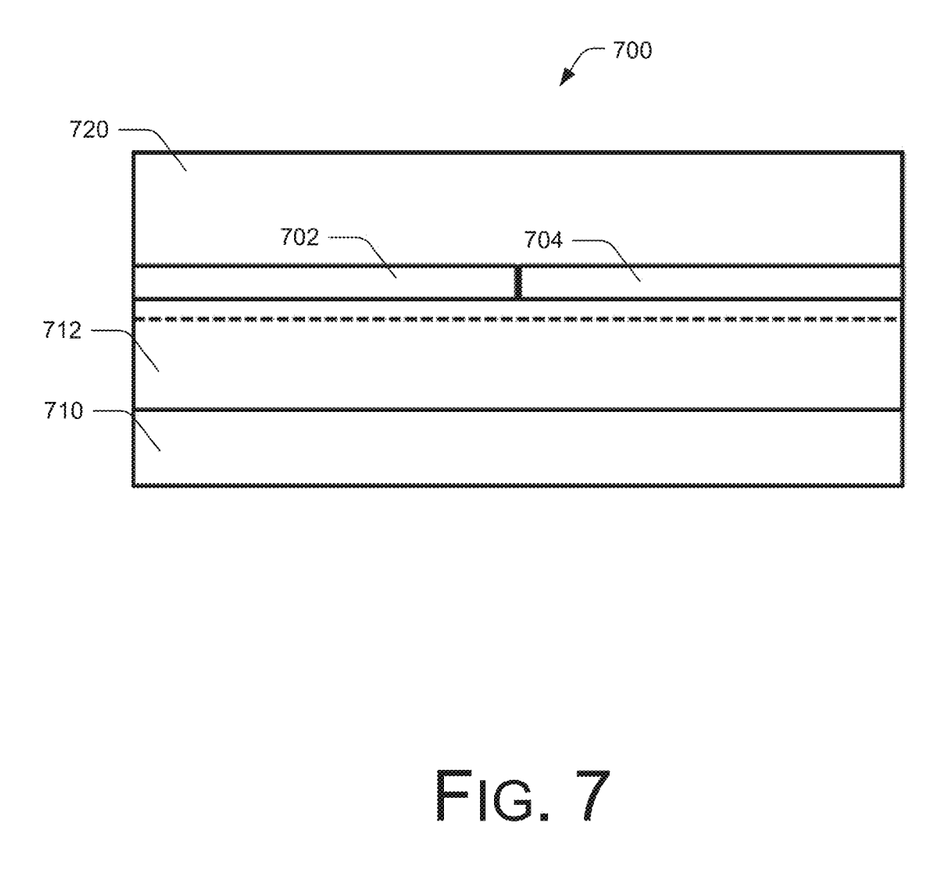
FIG. 7 shows a schematic cross section of a semiconductor device.

FIG. 7 shows a schematic cross section of a semiconductor device 700 according to an embodiment. The semiconductor device 700 comprises at least one first contact region 702 between a semiconductor substrate 710 of the semiconductor device 700 and an electrically conductive structure 720 arranged adjacent to the semiconductor substrate 710. Further, the semiconductor device 700 comprises at least one second contact region 704 between the semiconductor substrate 710 of the semiconductor device 700 and the electrically conductive structure 720. The at least one first contact region 702 is arranged adjacent to the at least one second contact region 704. The electrically conductive structure 720 comprises a first electrically conductive material in contact with the semiconductor substrate in an area of the at least one first contact region 702 and a second electrically conductive material in contact with the semiconductor substrate 110 in an area of the at least one second contact region 704 so that the first contact characteristic within the at least one first contact region 702 differs from a second contact characteristic within the at least one second contact region 704.

By implementing regions with different contact characteristics, the induction efficiency between the electrically conductive structure 720 and semiconductor substrate 710 can be adapted or influenced. Different contact characteristics can be easily implemented by using different electrically conductive materials in contact with the semiconductor device, for example.

For example, the first contact characteristic may be different from the second contact characteristic, if the first electrically conductive material comprises another contact resistance towards the semiconductor substrate 710 than the second electrically conductive material. For example, an average resistance between the semiconductor substrate 710 and the first electrically conductive material may be larger than twice (or larger than 3×, or larger than 5×, or larger than 10×) an average resistance (averaged over the second contact region) between the semiconductor substrate 710 and the second electrically conductive material.

Alternatively, the first contact characteristic may be an ohmic characteristic so that the first contact region represents an ohmic contact region and the second contact characteristic may be a Schottky characteristic so that the second contact region represents a Schottky contact region, for example.

More details and aspects are mentioned in connection with the concept or one or more embodiments described above. Especially details and aspects mentioned in connection with the electrically conductive structure, the first contact region (e.g. similar to the ohmic contact region), the second contact region (e.g. similar to the Schottky contact region), a first electrically conductive material, a second electrically conductive material and/or a first doping layer arranged at the main surface of the semiconductor substrate may be similarly applicable to the semiconductor device 700.

Figure 8:
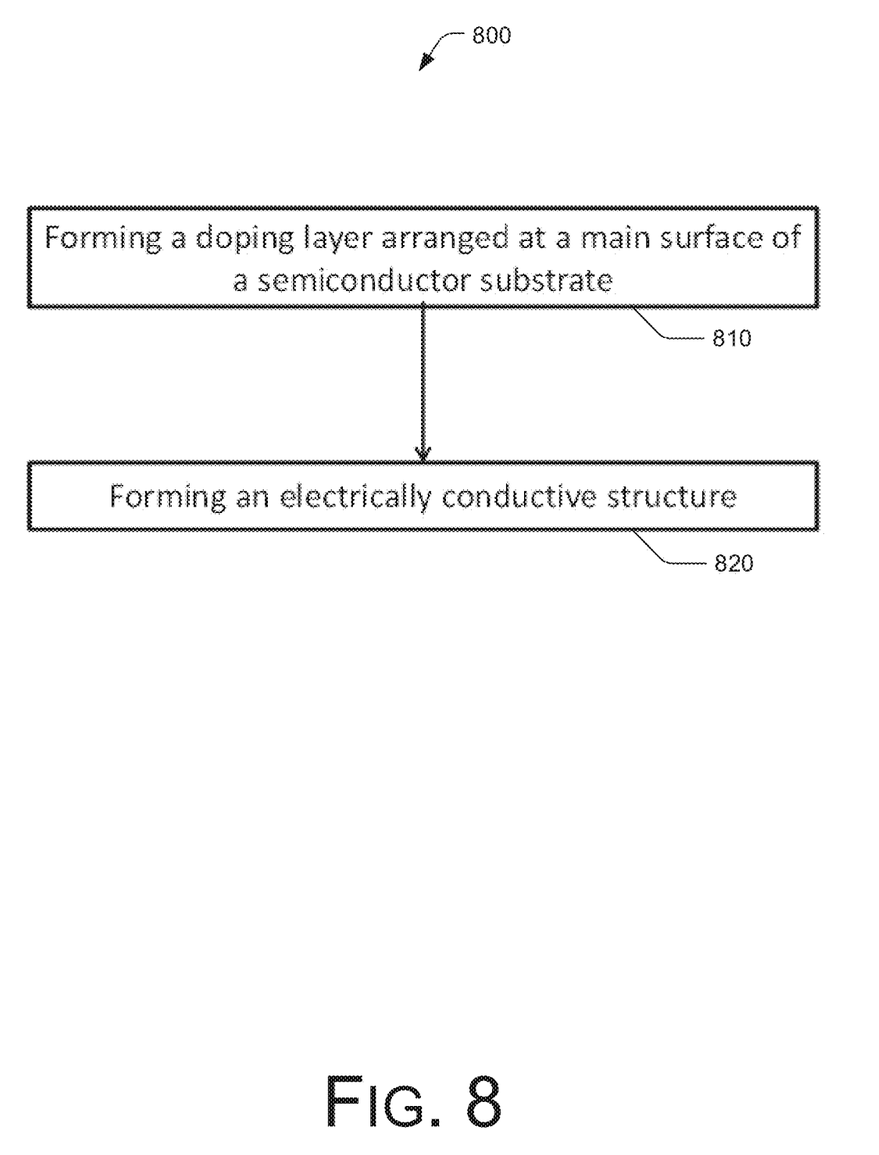
FIG. 8 shows a flow chart of a method for forming a semiconductor device.

FIG. 8 shows a flow chart of a method 800 for forming a semiconductor device according to an embodiment. The method 800 comprises forming 810 a doping layer arranged at the main surface of a semiconductor substrate at least by homogenously implanting dopants within at least one first contact region and at least one second contact region arranged adjacent to the at least one first contact region. Further, the method 800 comprises forming 820 an electrically conductive structure arranged adjacent to the semiconductor substrate so that contact characteristic in an area of the at least one first contact region differs from the contact characteristic in an area of the at least one second contact region.

The method 800 may comprise optional additional acts corresponding to one or more aspects mentioned in connection with the described concept or one or more embodiments described above.

Some embodiments relate to a diode with reduced anode efficiency and a method for forming a diode. The switching losses of a diode may be defined by the flooding charge of the diode in an on-state, which is cleared at the transition to the blocking state, for example. The flooding charge may be influenced by three technological parameters indicated by the injection efficiency of the anode (e.g. front side p-well), the injection efficiency of the cathode (e.g. backside n-contact) and the ambipolar lifetime of the carriers in the drift zone. A fast diode may be implemented by improving or optimizing one or all parameters, for example.

For example, a high voltage diode may be implemented with a homogenous anode in the active region and a suitable selection of a structured contacting implementing regions of alternating ohmic and Schottky contacts towards the anode.

In an on-state, the n-region (drift zone) may be flooded by a number of electron-hole-pairs significantly larger than the doping of the drift zone. For reducing the on-state losses and/or switching losses, a homogenous flooding may be desired, which may lead to a rough switch-off behavior, for example. For implementing a smoothly switching diode, larger switching losses may be acceptable and more charge carriers may be injected at the backside, for example.

For example, the improvement of the anode efficiency may be combined with an adaptation (optimization) of the cathode efficiency. The structures at the anode side and the cathode side may be selected so that a risk of current filamentation may be avoided or reduced. For example, in the case of a stripe layout at the front side and the backside, the stripes at the anode side may be arranged orthogonal to the stripes at the cathode side. For other mentioned arrangements of regions at the anode side, the backside structure may be adjusted so that below each region (Schottky contact region or ohmic contact region) at the anode side both kinds of backside regions may be implemented in the vertical projection, for example.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device, comprising:
    at least one ohmic contact region between a semiconductor substrate of the semiconductor device and an electrically conductive structure arranged adjacent to the semiconductor substrate; and
    at least one Schottky contact region between the semiconductor substrate of the semiconductor device and the electrically conductive structure, wherein the at least one ohmic contact region is arranged adjacent to the at least one Schottky contact region,
    wherein the semiconductor substrate comprises a first doping layer arranged adjacent to the electrically conductive structure, wherein an average doping concentration of a surface region of the first doping layer in an area of the at least one ohmic contact region differs from an average doping concentration of the surface region of the first doping layer in an area of the at least one Schottky contact region by less than 10% of the average doping concentration of the surface region of the first doping layer in the area of the at least one Schottky contact region.

2. The semiconductor device according to claim 1, wherein the semiconductor substrate comprises a second doping layer arranged adjacent to the first doping layer, wherein the first doping layer comprises at least mainly a first conductivity type and the second doping layer comprises at least mainly a second conductivity type.

3. The semiconductor device according to claim 1, wherein the semiconductor substrate comprises a first average defect density within the surface region of the first doping layer in the area of the at least one ohmic contact region and a second average defect density within the surface region of the first doping layer in the area of the at least one Schottky contact region, wherein the first average defect density is higher than the second average defect density.

4. The semiconductor device according to claim 1, wherein the surface region of the first doping layer comprises an average depth of less than 10% of an average thickness of the first doping layer.

5. The semiconductor device according to claim 1, wherein the surface region of the first doping layer comprises an average depth of less than 250 nm.

6. The semiconductor device according to claim 1, wherein a maximal lateral dimension of the at least one ohmic contact region or the at least one Schottky contact region is smaller than a thickness of the semiconductor substrate or smaller than twice a diffusion length of charge carriers within the semiconductor substrate.

7. The semiconductor device according to claim 1, further comprising an edge region located at an edge of the semiconductor substrate surrounding an active region of the semiconductor substrate, wherein the at least one ohmic contact region and the at least one Schottky contact region are arranged within the active region of the semiconductor substrate.

8. The semiconductor device according to claim 1, comprising a plurality of ohmic contact regions separated by at least one Schottky contact region or a plurality of Schottky contact regions separated by at least one ohmic contact region.

9. The semiconductor device according to claim 1, wherein an average area of the semiconductor substrate occupied by an ohmic contact region decreases from a center of the semiconductor substrate towards an edge of the semiconductor substrate.

10. The semiconductor device according to claim 1, wherein an average thickness of the first doping layer in the area of the at least one ohmic contact region differs from an average thickness of the first doping layer in the area of the at least one Schottky contact region by less than 10% of the average thickness of the first doping layer in the area of the at least one Schottky contact region.

11. The semiconductor device according to claim 1, implementing a semiconductor diode device.

12. The semiconductor device according to claim 1, comprising a blocking voltage of more than 100V.

13. The semiconductor device according to claim 1, wherein the electrically conductive structure comprises a first electrically conductive material in contact with the semiconductor substrate within the at least one ohmic contact region and a second electrically conductive material in contact with the semiconductor substrate within the at least one Schottky contact region.

14. The semiconductor device according to claim 13, wherein the first electrically conductive material comprises aluminum, copper, an aluminum silicon alloy, an aluminum silicon copper alloy, gold, a platinum silicon alloy, an iridium silicon alloy or an osmium silicon alloy.

15. The semiconductor device according to claim 13, wherein the second electrically conductive material comprises titanium or a titanium tungsten alloy.

16. The semiconductor device according to claim 13, wherein the electrically conductive structure comprises an electrically conductive layer comprising the first electrically conductive material covering the second electrically conductive material or the electrically conductive structure comprises an electrically conductive layer comprising the second electrically conductive material covering the first electrically conductive material.

17. A method for forming a semiconductor device, the method comprising:

forming at least one ohmic contact region between a semiconductor substrate of the semiconductor device and an electrically conductive structure arranged adjacent to the semiconductor substrate; and forming at least one Schottky contact region between the semiconductor substrate of the semiconductor device and the electrically conductive structure, wherein the at least one ohmic contact region is arranged adjacent to the at least one Schottky contact region, wherein the semiconductor substrate comprises a first doping layer arranged adjacent to the electrically conductive structure, wherein an average doping concentration of a surface region of the first doping layer in an area of the at least one ohmic contact region differs from an average doping concentration of the surface region of the first doping layer in an area of the at least one Schottky contact region by less than 10% of the average doping concentration of the surface region of the first doping layer in the area of the at least one Schottky contact region.

* * * * *